United States Patent
Hung et al.

(10) Patent No.: US 11,189,604 B2
(45) Date of Patent: Nov. 30, 2021

(54) DEVICE ASSEMBLY STRUCTURE AND METHOD OF MANUFACTURING THE SAME

(71) Applicant: Advanced Semiconductor Engineering, Inc., Kaohsiung (TW)

(72) Inventors: Chao-Kai Hung, Kaohsiung (TW); Chien-Wei Chang, Kaohsiung (TW); Ya-Chen Shih, Kaohsiung (TW); Hung-Jung Tu, Kaohsiung (TW); Hung-Yi Lin, Kaohsiung (TW); Cheng-Yuan Kung, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/653,650

(22) Filed: Oct. 15, 2019

(65) Prior Publication Data
US 2021/0111165 A1  Apr. 15, 2021

(51) Int. Cl.
*H01L 25/16* (2006.01)
*H01L 23/00* (2006.01)
*H01L 25/00* (2006.01)

(52) U.S. Cl.
CPC ............. *H01L 25/16* (2013.01); *H01L 24/05* (2013.01); *H01L 24/11* (2013.01); *H01L 24/13* (2013.01);
(Continued)

(58) Field of Classification Search
CPC ........ H01L 24/05; H01L 24/11; H01L 24/13; H01L 24/29; H01L 24/94; H01L 25/16; H01L 25/50; H01L 25/03; H01L 25/0655; H01L 25/117; H01L 2924/12; H01L 2924/143; H01L 2924/00014; H01L 2924/00; H01L 2924/14; H01L 2924/73265; H01L 2224/08145;
(Continued)

(56) References Cited

U.S. PATENT DOCUMENTS

| | | | | |
|---|---|---|---|---|
| 6,943,067 B2* | 9/2005 | Greenlaw | ......... | H01L 21/76898 438/152 |
| 8,012,802 B2* | 9/2011 | Sasaki | ................. | H01L 25/0657 438/109 |

(Continued)

OTHER PUBLICATIONS

Quirk, Semiconductor Manufacturing Technology, Prentice-Hall, 2001, pp. 435-437 (Year: 2001).*

*Primary Examiner* — Nikolay K Yushin
(74) *Attorney, Agent, or Firm* — Foley & Lardner LLP

(57) ABSTRACT

A device assembly structure includes a first device and at least one second device. The first device has a first active surface and a first backside surface opposite to the first active surface, and includes a plurality of first electrical contacts disposed adjacent to the first active surface. The second device has a second active surface and a second backside surface opposite to the second active surface, and includes a plurality of second electrical contacts disposed adjacent to the second active surface. The second active surface of the second device faces the first active surface of the first device, the second electrical contacts of the second device are electrically connected to the first electrical contacts of the first device, and a thickness of the second device is less than or equal to one fifth of a thickness of the first device.

9 Claims, 18 Drawing Sheets

(52) U.S. Cl.
CPC ............... *H01L 24/29* (2013.01); *H01L 24/94* (2013.01); *H01L 25/50* (2013.01); *H01L 2924/12* (2013.01); *H01L 2924/143* (2013.01)

(58) Field of Classification Search
CPC ....... H01L 2224/16195; H01L 2224/94; H01L 2224/08195; H01L 2224/32195; H01L 2224/32145; H01L 2224/16145; H01L 2224/73204; H01L 2224/83; H01L 2224/97; H01L 2224/80; H01L 2224/81; H01L 2224/11; H01L 2225/06517; H01L 2225/06524; H01L 2225/06568; H01L 2225/06513
See application file for complete search history.

(56) References Cited

U.S. PATENT DOCUMENTS

| | | | | |
|---|---|---|---|---|
| 8,263,434 B2* | 9/2012 | Pagaila | ................... | H01L 24/73 438/109 |
| 8,860,079 B2* | 10/2014 | Ng | ......................... | H01L 24/73 257/124 |
| 9,875,982 B2* | 1/2018 | Chen | ...................... | H01L 24/16 |
| 10,553,562 B2* | 2/2020 | Sadaka | ................... | H01L 24/92 |
| 2003/0129829 A1* | 7/2003 | Greenlaw | ............... | H01L 21/84 438/637 |
| 2011/0024888 A1* | 2/2011 | Pagaila | ............... | H01L 25/0657 257/686 |
| 2011/0189820 A1* | 8/2011 | Sasaki | ..................... | H01L 24/96 438/107 |
| 2012/0220082 A1* | 8/2012 | Ng | ........................ | H01L 21/568 438/124 |
| 2012/0248621 A1* | 10/2012 | Sadaka | ................. | H01L 23/481 257/774 |
| 2017/0352634 A1* | 12/2017 | Chen | ..................... | H01L 23/481 |

\* cited by examiner

DEVICE ASSEMBLY STRUCTURE AND METHOD OF MANUFACTURING THE SAME

BACKGROUND

1. Technical Field

The present disclosure generally relates to a device assembly structure and a method of manufacturing the same, and to a device assembly structure including at least one thinner device attached to a thicker device, and a method of manufacturing the same.

2. Description of the Related Art

Design trends in the semiconductor industry include weight reduction, multi-functions and miniaturization of semiconductor products. Thus, a system-in-package (SiP) containing multiple electronic devices (or electronic elements) in a single package is rapidly promoted. A semiconductor package may include a lower device, an upper device and a redistribution layer (RDL) interposed therebetween. When the lower device and/or the upper device become thinner and thinner, it is more and more difficult to handle the lower device and/or the upper device during a manufacturing process. For example, the thin device may break or crack readily during a pick-and-place process. Thus, a thickness of the lower device and/or the upper device may not be reduced efficiently. Accordingly, the total thickness of the semiconductor package may not be reduced efficiently.

SUMMARY

In accordance with an aspect of the present disclosure, a device assembly structure includes a first device and at least one second device. The first device has a first active surface and a first backside surface opposite to the first active surface, and includes a plurality of first electrical contacts disposed adjacent to the first active surface. The second device has a second active surface and a second backside surface opposite to the second active surface, and includes a plurality of second electrical contacts disposed adjacent to the second active surface. The second active surface of the second device faces the first active surface of the first device, the second electrical contacts of the second device are electrically connected to the first electrical contacts of the first device, and a thickness of the second device is less than or equal to one fifth of a thickness of the first device.

In accordance another aspect of the present disclosure, a device assembly structure includes a first device and at least one second device. The first device includes a plurality of first electrical contacts. The second device includes a plurality of second electrical contacts. The second electrical contacts of the second device contact the first electrical contacts of the first device directly. A thickness of the second device is less than or equal to 100 µm.

In accordance another aspect of the present disclosure, a method of manufacturing a device assembly structure includes (a) electrically connecting and bonding at least one second electronic structure to a first electronic structure; (b) thinning the second electronic structure; and (c) removing portions of the second electronic structure to form a plurality of second devices and expose portions of the first electronic structure.

Figure 1:
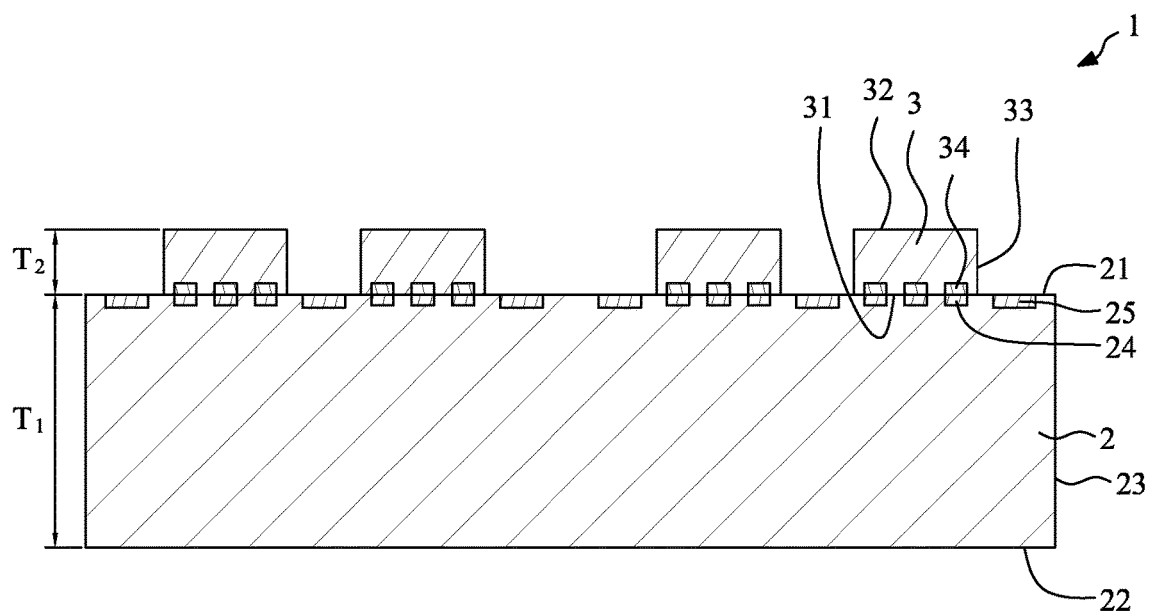
FIG. 1 illustrates a cross-sectional view of a device assembly structure in accordance with some embodiments of the present disclosure.

Common reference numerals are used throughout the drawings and the detailed description to indicate the same or similar components. The present disclosure can be best understood from the following detailed description taken in conjunction with the accompanying drawings.

DETAILED DESCRIPTION

The following disclosure provides for many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. Besides, the present disclosure may repeat reference numerals and/or letters in the various examples. This repetition is for simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

FIG. 1 illustrates a cross-sectional view of a device assembly structure 1 in accordance with some embodiments of the present disclosure. The device assembly structure 1 includes a first device 2 and at least one second device 3. In some embodiments, the device assembly structure 1 may be a semiconductor device assembly structure.

The first device 2 may be a semiconductor device. For example, the first device 2 may be an active element such as an application processor die. As shown in FIG. 1, the first device 2 may have a first active surface 21 (e.g., an upper surface), a first backside surface 22 (e.g., a lower surface) opposite to the first active surface 21, and a lateral surface 23 extending between the first active surface 21 and the first backside surface 22. In addition, the first device 2 may include a base body including silicon, germanium, or other suitable material. In some embodiments, the first device 2 may further include at least one dielectric layer and at least one circuit layer disposed on the base body. A thickness $T_1$ of the first device 2 may be 500 micrometers (μm) to 800 or 600 μm to 700 μm.

As shown in FIG. 1, the first device 2 may include a plurality of first electrical contacts 24 and a plurality of bonding pads 25 disposed adjacent to the first active surface 21. The first electrical contacts 24 and the bonding pads 25 may be exposed from the first active surface 21 for electrical connection. The first electrical contacts 24 and the bonding pads 25 may include copper, aluminum, gold, or other suitable material. The first electrical contacts 24 may be pads, bumps, studs, pillars or posts. The top surfaces of the first electrical contacts 24 and the bonding pads 25 may be substantially coplanar with the first active surface 21. However, in other embodiments, the top surfaces of the first electrical contacts 24 and the bonding pads 25 may be recessed from the first active surface 21. Alternatively, the first electrical contacts 24 and the bonding pads 25 may protrude from the first active surface 21. A size of the bonding pad 25 may be greater than a size of the first electrical contact 24. A pitch between the bonding pads 25 may be greater than a pitch between the first electrical contacts 24.

The at least one second device 3 may include a plurality of second devices 3 disposed on the first active surface 21 of the first device 2 side by side. Each of the second devices 3 may be a semiconductor device. For example, each of the second devices 3 may be a passive element such as a decoupling capacitor, an inductor, or a filter including a capacitor and an inductor. As shown in FIG. 1, the second device 3 may have a second active surface 31 (e.g., a lower surface), a second backside surface 32 (e.g., an upper surface) opposite to the second active surface 31, and a lateral surface 33 extending between the second active surface 31 and the second backside surface 32. In addition, the second devices 3 may include a base body including silicon, germanium, or other suitable material. In some embodiments, the second devices 3 may further include at least one dielectric layer and at least one circuit layer disposed on the base body. A thickness $T_2$ of the second devices 3 may be less than or equal to 100 μm, less than or equal to 50 μm, or less than or equal to 10 μm. Thus, the thickness $T_2$ of the second device 3 may be less than or equal to one fifth of the thickness $T_1$ of the first device 2. Alternatively, the thickness $T_2$ of the second device 3 may be less than or equal to one tenth one fiftieth of the thickness $T_1$ of the first device 2.

The second backside surfaces 32 of the second devices 3 may be substantially coplanar with each other since the second backside surfaces 32 of the second devices 3 are formed at a same thinning process. In one embodiment, the coplanarity of the second backside surfaces 32 of the second devices 3 may be about ±3 μm, about ±1 μm, about ±0.5 μm, or less. In other words, the deviations of the levels of the second backside surfaces 32 of the second devices 3 from the thickness $T_2$ are within a range of about 3 μm, about 1 μm, about 0.5 μm, or less.

As shown in FIG. 1, the second device 3 may include a plurality of second electrical contacts 34 disposed adjacent to the second active surface 31. In addition, the second electrical contacts 34 may be exposed from the second active surface 31 for electrical connection. The second electrical contacts 34 may include copper, aluminum, gold, or other suitable material. The second electrical contacts 34 may be pads, bumps, studs, pillars or posts. The bottom surfaces of the second electrical contacts 34 may be substantially coplanar with the second active surface 31. However, in other embodiments, the bottom surfaces of the second electrical contacts 34 may be recessed from the second active surface 31. Alternatively, the second electrical contacts 34 may protrude from the second active surface 31.

In some embodiments, the second electrical contacts 34 of the second device 3 may be aligned with the first electrical contacts 24 of the first device 2. A size of the second electrical contact 34 of the second device 3 may be substantially equal to the size of the first electrical contact 24 of the first device 2. A pitch between the second electrical contacts 34 of the second device 3 may be substantially equal to a pitch between the first electrical contacts 24 of the first device 2. As shown in FIG. 1, the second active surface 31 of the second device 3 faces the first active surface 21 of the first device 2, and the second electrical contacts 34 of the second device 3 are electrically connected to the first electrical contacts 24 of the first device 2. For example, the second electrical contacts 34 of the second device 3 may contact the first electrical contacts 24 of the first device 2 directly. That is, the second electrical contacts 34 of the second device 3 are attached to the first electrical contacts 24 of the first device 2 through metal-to-metal bonding rather than surface mounting technology (SMT) or flip-chip bonding. Hence, there may be no intermediate material (e.g., solder material) between the second electrical contacts 34 of the second device 3 and the first electrical contacts 24 of the first device 2. Thus, the electrical path between the second device 3 and the first device 2 is shortened. In addition, since the electrical resistivity value of the intermediate material (e.g., solder material) is relatively large, the lack of the intermediate material (e.g., solder material) may improve the decoupling effect. In one embodiment that a material of the second electrical contacts 34 of the second device 3 includes copper, and a material of the first electrical contacts 24 of the first device 2 also includes copper, such metal-to-metal bonding is copper-to-copper bonding. In addition, the second active surface 31 of the second device 3 may substantially contact the first active surface 21 of the first device 2.

In the embodiment illustrated in FIG. 1, the second electrical contacts 34 of the second device 3 may contact the first electrical contacts 24 of the first device 2 directly; thus, the electrical path between the second device 3 and the first device 2 may be shortened. In addition, since the thickness $T_2$ of the second device 3 may be less than or equal to one fifth of the thickness $T_1$ of the first device 2, the total thickness of the device assembly structure 1 may be reduced efficiently.

Figure 2:
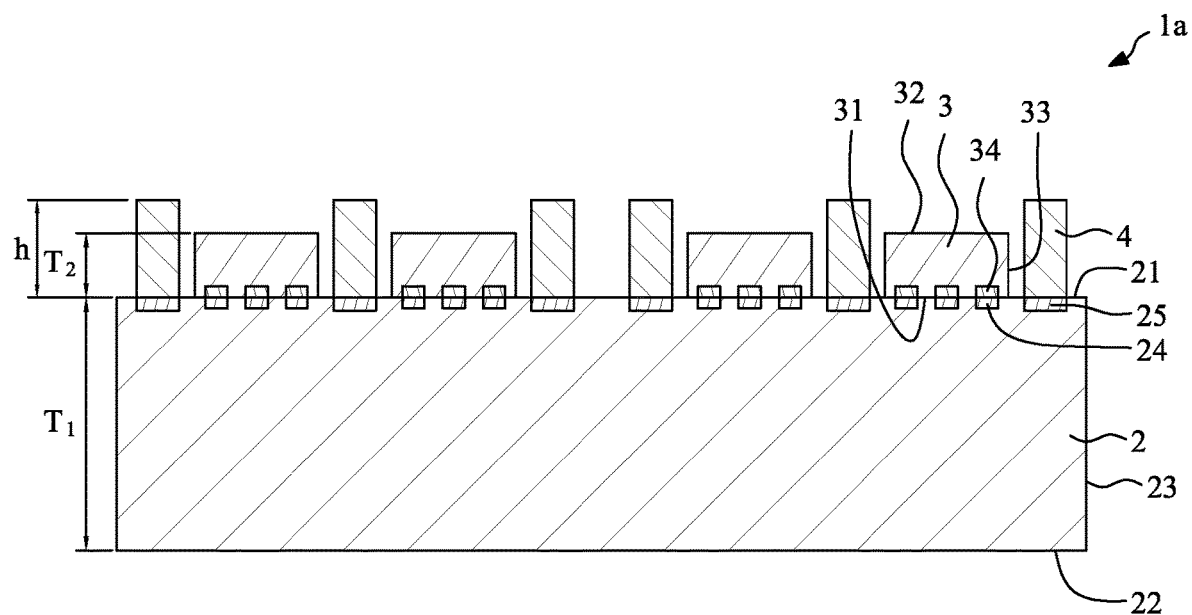
FIG. 2 illustrates a cross-sectional view of a device assembly structure in accordance with some embodiments of the present disclosure.

FIG. 2 illustrates a cross-sectional view of a device assembly structure 1a in accordance with some embodiments of the present disclosure. The device assembly structure la is similar to the device assembly structure 1 in FIG. 1 except that a plurality of conductive pillars 4 are further included. The conductive pillars 4 are disposed on or electrically connected to the bonding pads 25 of the first device 2. Thus, the conductive pillars 4 may be disposed adjacent to the first active surface 21 of the first device 2, and surround the second devices 3. A height h of the conductive pillar 4 may be greater than the thickness $T_2$ of the second device 3. In some embodiments, the height h of the conductive pillar 4 may be less than or equal to 50 μm, less than or equal to 30 μm, or less than or equal to 20 μm. Since the thickness $T_2$ of the second device 3 is reduced, the size (e.g., the height h and the width) of the conductive pillar 4 may be reduced accordingly. Thus, the density of the conductive pillars 4 may be increased.

Figure 3:
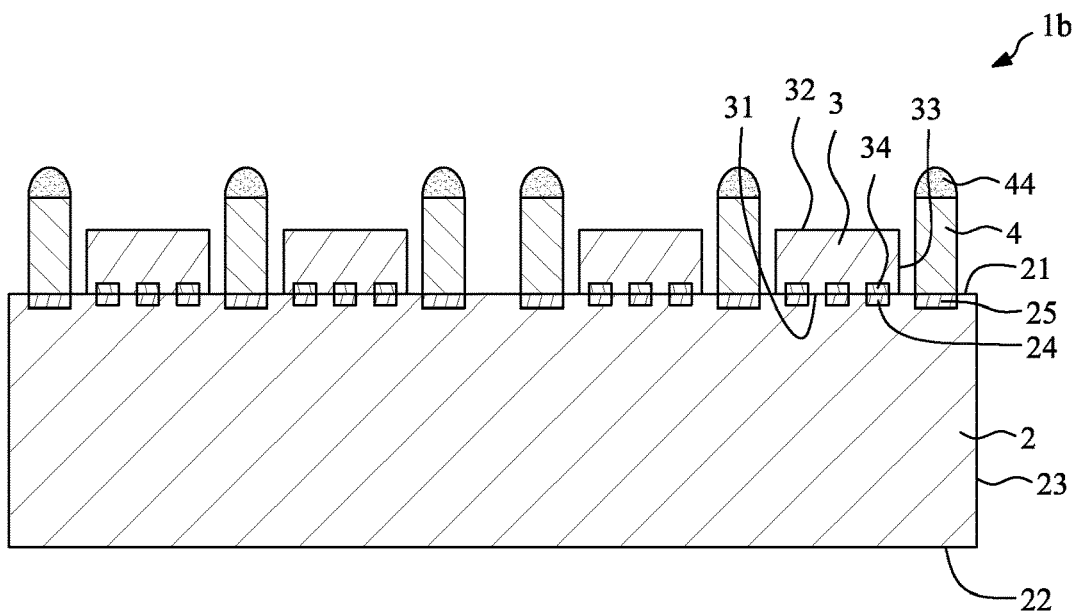
FIG. 3 illustrates a cross-sectional view of a device assembly structure in accordance with some embodiments of the present disclosure.

FIG. 3 illustrates a cross-sectional view of a device assembly structure 1b in accordance with some embodiments of the present disclosure. The device assembly structure 1b is similar to the device assembly structure 1a in FIG. 2 except that a plurality of connecting materials 44 are further included. The connecting materials 44 may be solder materials (e.g., solder balls or solder pastes) or pre-solder materials, and may be disposed on the tips of the conductive pillars 4.

Figure 4:
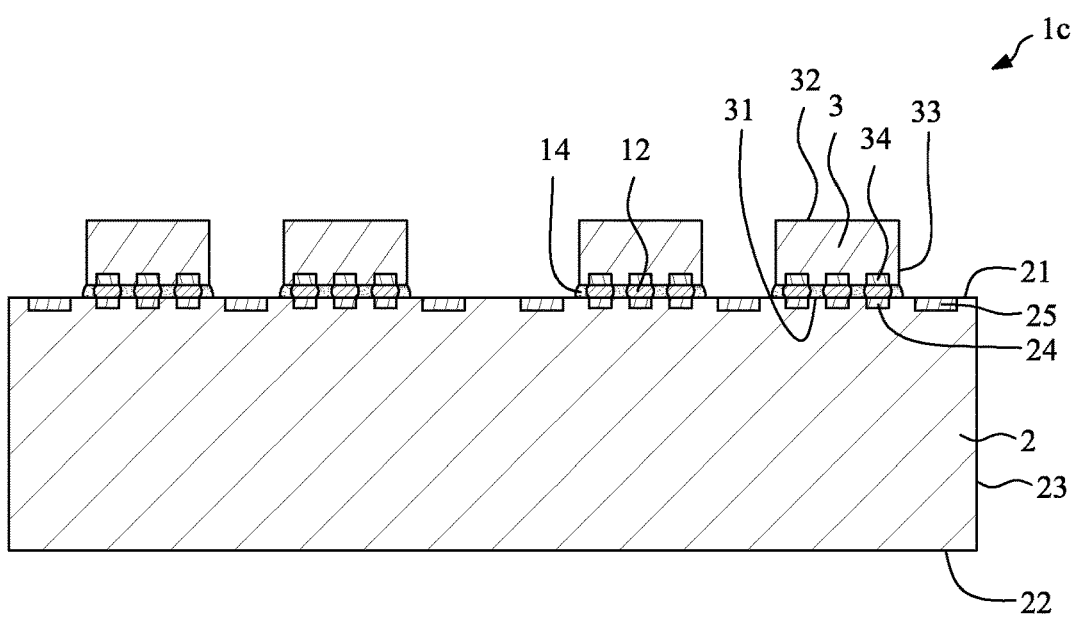
FIG. 4 illustrates a cross-sectional view of a device assembly structure in accordance with some embodiments of the present disclosure.

FIG. 4 illustrates a cross-sectional view of a device assembly structure 1c in accordance with some embodiments of the present disclosure. The device assembly structure 1c is similar to the device assembly structure 1 in FIG. 1 except that an intermediate material 12 and an underfill 14 may be further interposed between the second electrical contacts 34 of the second device 3 and the first electrical contacts 24 of the first device 2. That is, the second electrical contacts 34 of the second device 3 may not contact the first electrical contacts 24 of the first device 2 directly. The intermediate material 12 may include a plurality of solder balls or solder pastes. Alternatively, the intermediate material 12 may be a redistribution layer (RDL). As shown in FIG. 4, the second electrical contacts 34 of the second device 3 may be connected to the first electrical contacts 24 of the first device 2 through the intermediate material 12. Thus, the second device 3 may be attached to the first device 2 through surface mounting technology (SMT) or flip-chip bonding. The underfill 14 may be disposed in a space between the second active surface 31 of the second device 3 and the first active surface 21 of the first device 2 to cover and protect the intermediate material 12.

Figure 5:
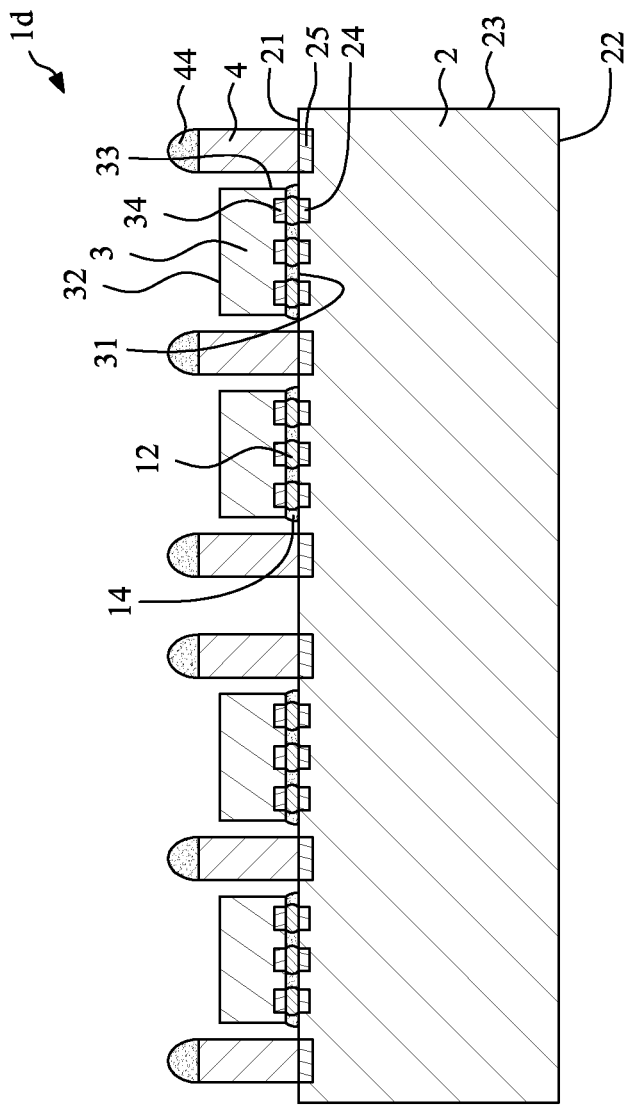
FIG. 5 illustrates a cross-sectional view of a device assembly structure in accordance with some embodiments of the present disclosure.

FIG. 5 illustrates a cross-sectional view of a device assembly structure 1d in accordance with some embodiments of the present disclosure. The device assembly structure 1d is similar to the device assembly structure 1c in FIG. 4 except that a plurality of conductive pillars 4 and a plurality of connecting materials 44 are further included. The conductive pillars 4 are disposed on or electrically connected to the bonding pads 25 of the first device 2. Thus, the conductive pillars 4 may be disposed adjacent to the first active surface 21 of the first device 2, and surround the second devices 3. A height h of the conductive pillar 4 may be greater than a sum of the thickness $T_2$ of the second device 3 and a height (or thickness) of the intermediate material 12. In some embodiments, the height h of the conductive pillar 4 may be less than or equal to 50 μm, less than or equal to 30 μm, or less than or equal to 20 μm. The connecting materials 44 may be solder materials (e.g., solder balls or solder pastes) or pre-solder materials, and may be disposed on the tips of the conductive pillars 4.

FIG. 6 through FIG. 16 illustrate a method for manufacturing a device assembly structure according to some embodiments of the present disclosure. In some embodiments, the method is for manufacturing the device assembly structure 1 shown in FIG. 1, the device assembly structure 1a shown in FIG. 2, and the device assembly structure 1b shown in FIG. 3.

Figure 6:
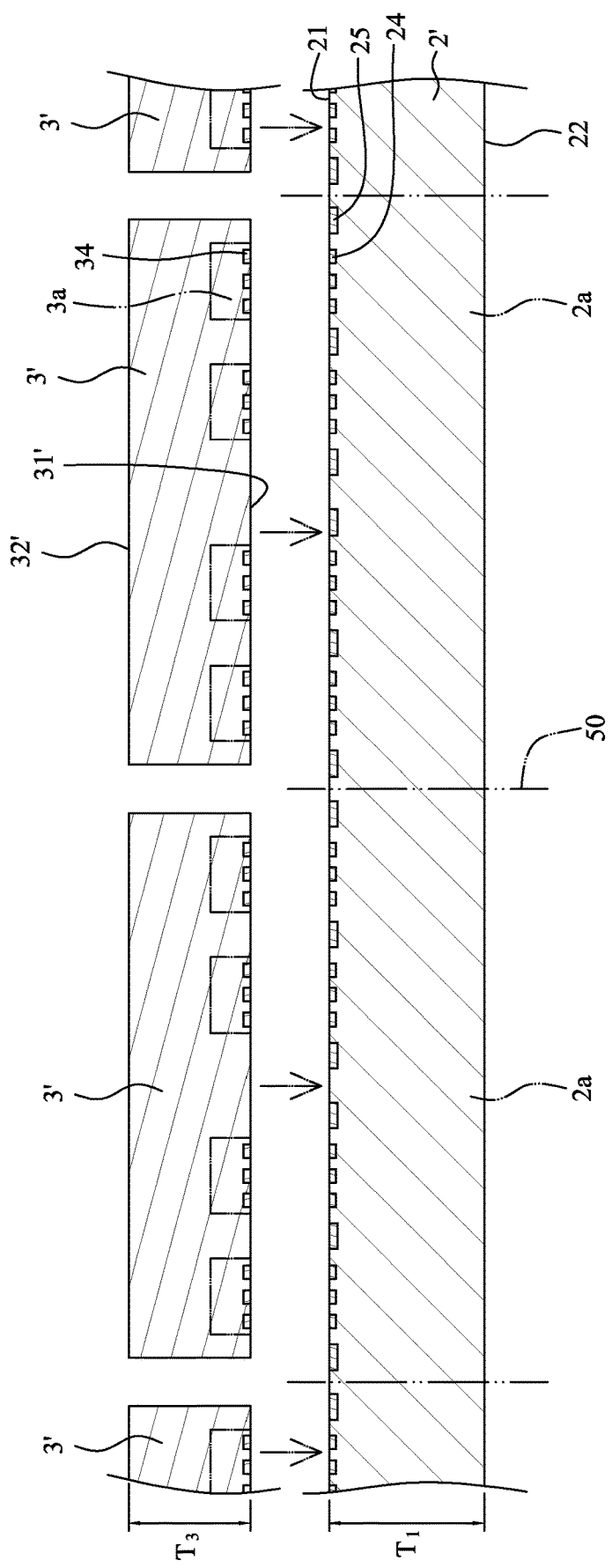
FIG. 6 illustrates one or more stages of an example of a method for manufacturing a device assembly structure according to some embodiments of the present disclosure.

Referring to FIG. 6, at least one second electronic structure 3' and a first electronic structure 2' are provided. The first electronic structure 2' may be a first wafer that may have a first active surface 21 (e.g., an upper surface) and a first backside surface 22 (e.g., a lower surface) opposite to the first active surface 21. For example, the first electronic structure 2' may include a base body including silicon, germanium, or other suitable material. In some embodiments, the first electronic structure 2' may further include at least one dielectric layer and at least one circuit layer disposed on the base body. A thickness $T_1$ of the first electronic structure 2' may be 500 μm to 800 μm, or 600 μm to 700 μm. In some embodiments, the first electronic structure 2' may be a first die or a first strip.

As shown in FIG. 6, the first electronic structure 2' may include a plurality of first electrical contacts 24 and a plurality of bonding pads 25 disposed adjacent to the first active surface 21. The first electrical contacts 24 and the bonding pads 25 may be exposed from the first active surface 21 for electrical connection. The first electrical contacts 24 and the bonding pads 25 may include copper, aluminum, gold, or other suitable material. The first electrical contacts 24 may be pads, bumps, studs, pillars or posts. The top surfaces of the first electrical contacts 24 and the bonding pads 25 may be substantially coplanar with the first active surface 21. However, in other embodiments, the top surfaces of the first electrical contacts 24 and the bonding pads 25 may be recessed from the first active surface 21. Alternatively, the first electrical contacts 24 and the bonding pads 25 may protrude from the first active surface 21. A size of the bonding pad 25 may be greater than a size of the first electrical contact 24. A pitch between the bonding pads 25 may be greater than a pitch between the first electrical contacts 24.

As shown in FIG. 6, the first electronic structure 2' may have a plurality of cutting lines 50 across each other to define a plurality of first units 2a. Each of the first units 2a may correspond to the first device 2 of FIG. 1. However, in other embodiments, the first electronic structure 2' may be the first device 2 of FIG. 1. That is, the first electronic structure 2' may be an active element such as an application processor die.

The at least one second electronic structure 3' may include a plurality of second electronic structures 3'. Each of the second electronic structures 3' may be a second die, and may include a plurality of second units 3a. The second units 3a may correspond to the second devices 3 of FIG. 1. For example, each of the second units 3a may be a passive element (e.g., a decoupling capacitor, an inductor, or a filter including a capacitor and an inductor) disposed in the second electronic structure 3'. As shown in FIG. 6, the second electronic structure 3' may have a second active surface 31' (e.g., a lower surface) and a second backside surface 32' (e.g., an upper surface) opposite to the second active surface 31'. The second units 3a may be disposed adjacent to the second active surface 31' of the second electronic structure 3'. In addition, the second electronic structure 3' may include a base body including silicon, germanium, or other suitable material. In some embodiments, the second electronic structure 3' may further include at least one dielectric layer and at least one circuit layer disposed on the base body. A thickness $T_3$ of the second electronic structure 3' may be 500 µm to 800 µm, or 600 µm to 700 µm. In one embodiment, the thickness $T_3$ of the second electronic structure 3' may be substantially equal to the thickness $T_1$ of the first electronic structure 2'. Since both of the first electronic structure 2' and the second electronic structure 3' may have a significant thickness, they are easily to be handled.

As shown in FIG. 6, the second electronic structure 3' may include a plurality of second electrical contacts 34 disposed adjacent to the second active surface 31' within the second units 3a. In addition, the second electrical contacts 34 may be exposed from the second active surface 31' for electrical connection. The second electrical contacts 34 may include copper, aluminum, gold, or other suitable material. The second electrical contacts 34 may be pads, bumps, studs, pillars or posts. The bottom surfaces of the second electrical contacts 34 may be substantially coplanar with the second active surface 31'. However, in other embodiments, the bottom surfaces of the second electrical contacts 34 may be recessed from the second active surface 31'. Alternatively, the second electrical contacts 34 may protrude from the second active surface 31'.

Figure 7:
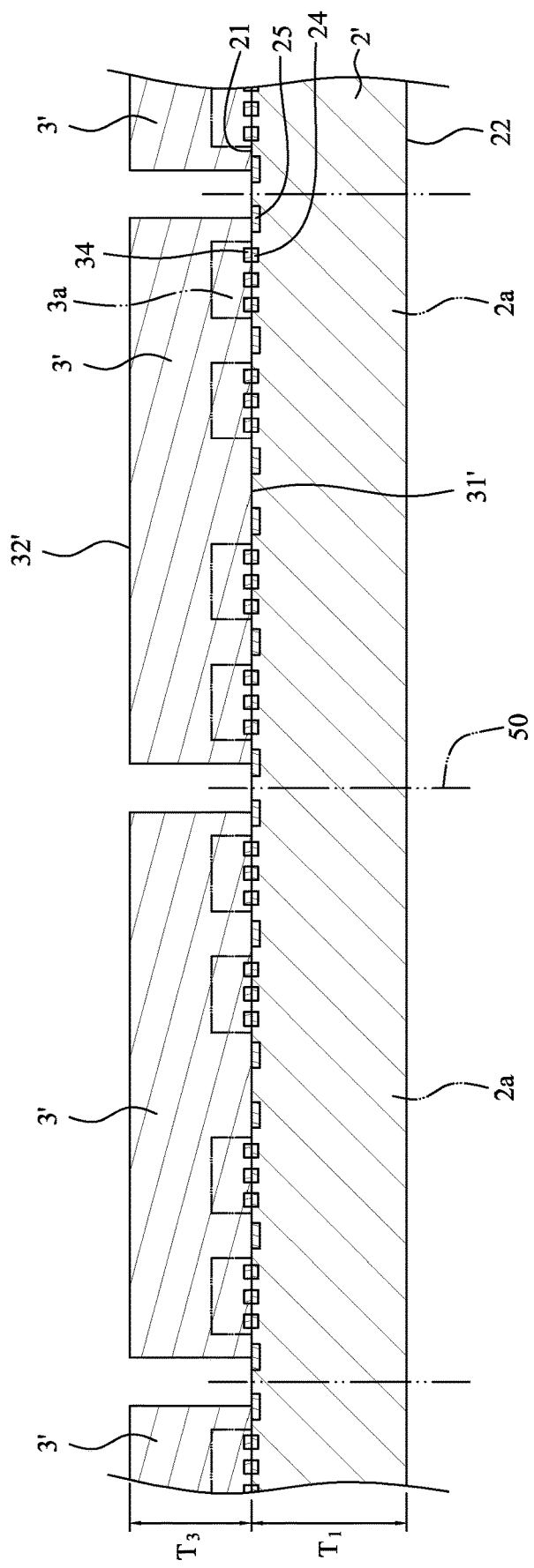
FIG. 7 illustrates a cross-sectional view taken along line 7-7 of FIG. 8.
Figure 8:
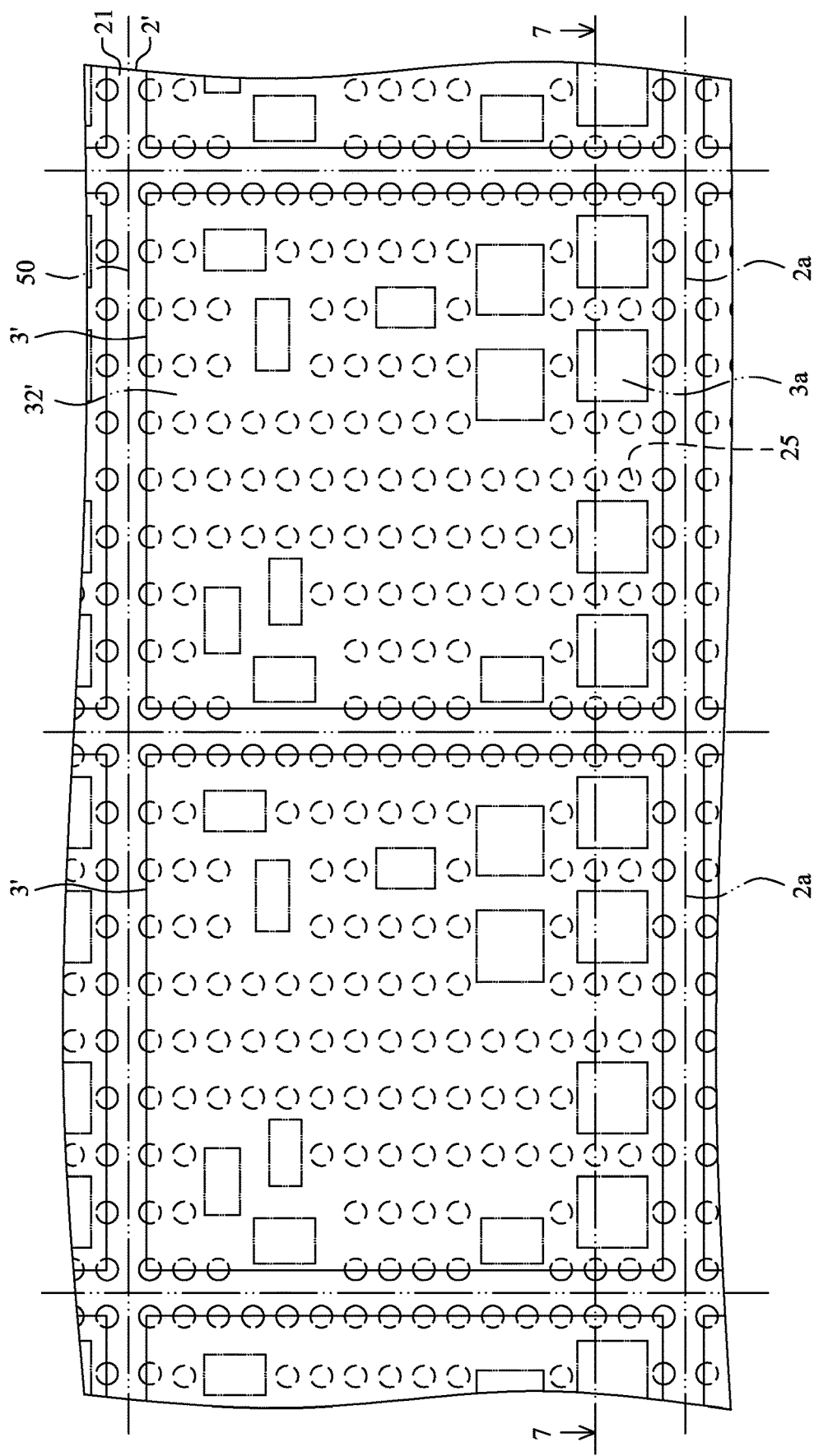
FIG. 8 illustrates one or more stages of an example of a method for manufacturing a device assembly structure according to some embodiments of the present disclosure.

Referring to FIG. 7 and FIG. 8, wherein FIG. 7 illustrates a cross-sectional view taken along line 7-7 of FIG. 8, the second electronic structures 3' may be disposed on the first active surface 21 of the first electronic structure 2' side by side. In some embodiments, the second electrical contacts 34 of the second electronic structures 3' may be aligned with the first electrical contacts 24 of the first electronic structure 2'. A size of the second electrical contact 34 of the second electronic structures 3' may be substantially equal to the size of the first electrical contact 24 of the first electronic structure 2'. A pitch between the second electrical contacts 34 of the second electronic structures 3' may be substantially equal to a pitch between the first electrical contacts 24 of the first electronic structure 2'. As shown in FIG. 7, the second active surface 31' of the second electronic structures 3' may face and contact the first active surface 21 of the first electronic structure 2', and the second electrical contacts 34 of the second electronic structures 3' may substantially contact the first electrical contacts 24 of the first electronic structure 2' directly.

Then, the second electronic structure 3' and the first electronic structure 2' are heated to an annealing temperature so that the second electrical contacts 34 of the second electronic structures 3' are electrically connected and bonded to the first electrical contact 24 of the first electronic structure 2'. In some embodiments, the annealing temperature may be below or equal to about 250° C., or below or equal to about 200° C. That is, the second electrical contacts 34 of the second electronic structures 3' are attached to the first electrical contacts 24 of the first electronic structure 2' through metal-to-metal bonding rather than surface mounting technology (SMT) or flip-chip bonding. Hence, there may be no intermediate material (e.g., solder material) between the second electrical contacts 34 of the second electronic structures 3' and the first electrical contacts 24 of the first electronic structure 2'. In one embodiment that a material of the second electrical contacts 34 of the second electronic structures 3' includes copper, and a material of the first electrical contacts 24 of the first electronic structure 2' also includes copper, such metal-to-metal bonding is copper-to-copper bonding.

Figure 9:
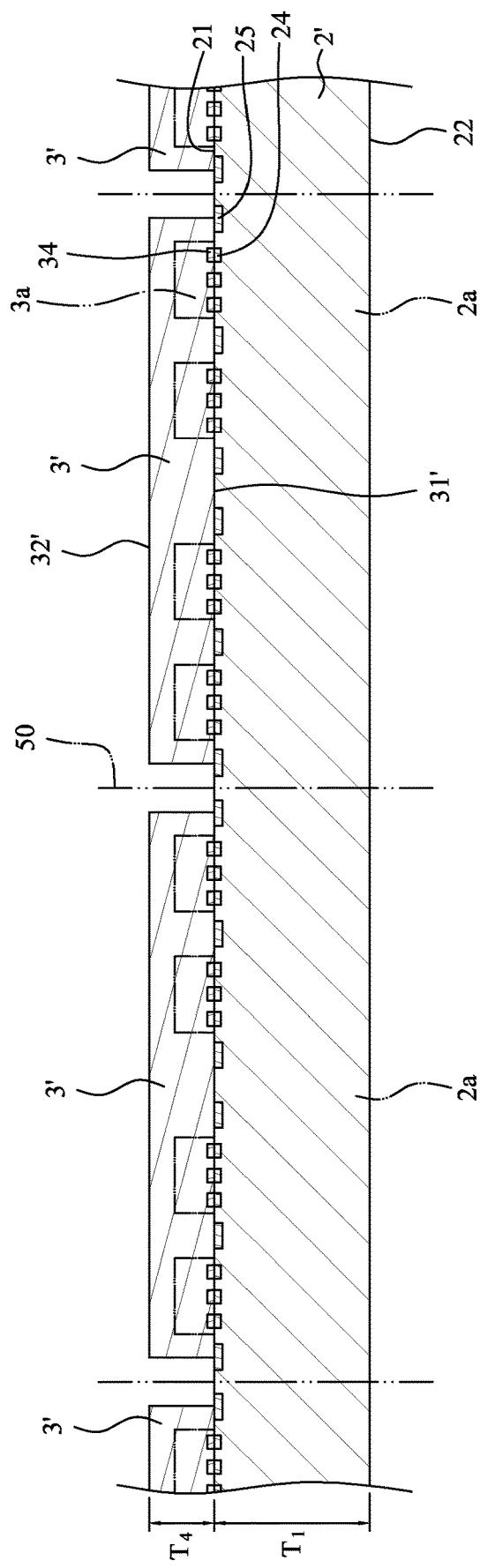
FIG. 9 illustrates one or more stages of an example of a method for manufacturing a device assembly structure according to some embodiments of the present disclosure.
Figure 10:
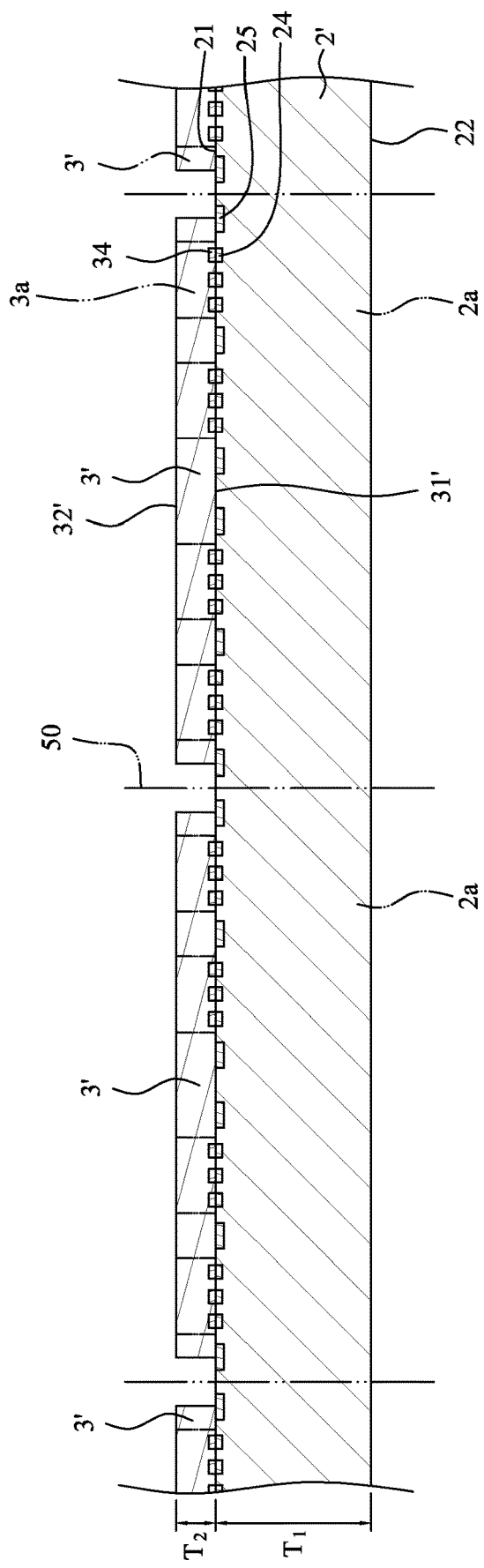
FIG. 10 illustrates one or more stages of an example of a method for manufacturing a device assembly structure according to some embodiments of the present disclosure.

Referring to FIG. 9 to FIG. 10, the second electronic structures 3' is thinned from its second backside surface 32' by two thinning processes. Referring to FIG. 9, a first thinning process is conducted. That is, the second electronic structure 3' is thinned from its second backside surface 32' by the first thinning process. In some embodiments, the first thinning process is grinding. Meanwhile, the thickness of the second electronic structures 3' is reduced from the thickness $T_3$ (FIG. 7) to a thickness $T_4$ (FIG. 9). The thickness $T_4$ of the second electronic structures 3' may be less than or equal to 150 µm, less than or equal to 100 µm, or less than or equal to 75 µm.

Referring to FIG. 10, a second thinning process is conducted. That is, the second electronic structure 3' is further thinned from its second backside surface 32' by the second thinning process. In some embodiments, the second thinning process is etching (e.g., wet etching). Meanwhile, the thickness of the second electronic structures 3' is reduced from the thickness $T_4$ (FIG. 9) to a thickness $T_2$ (FIG. 10). The thickness $T_2$ of the second electronic structures 3' may be less than or equal to 100 µm, less than or equal to 50 µm, or less than or equal to 10 µm. Thus, the thickness $T_2$ of the second electronic structures 3' may be less than or equal to one fifth of the thickness $T_1$ of the first electronic structure 2'. Alternatively, the thickness $T_2$ of the second electronic structures 3' may be less than or equal to one tenth one fiftieth of the thickness $T_1$ of the first electronic structure 2'.

The second backside surface 32' of the second electronic structures 3' may be substantially coplanar with each other since the second backside surfaces 32' of the second electronic structures 3' are formed at a same thinning process. In one embodiment, the coplanarity of the second backside surfaces 32' of the second electronic structures 3' may be about ±3 µm, about ±1 µm, about ±0.5 µm, or less. In other words, the deviations of the levels of the second backside surfaces 32' of the second electronic structures 3' from the thickness $T_2$ are within a range of about 3 µm, about 1 µm, about 0.5 µm, or less.

Figure 11:
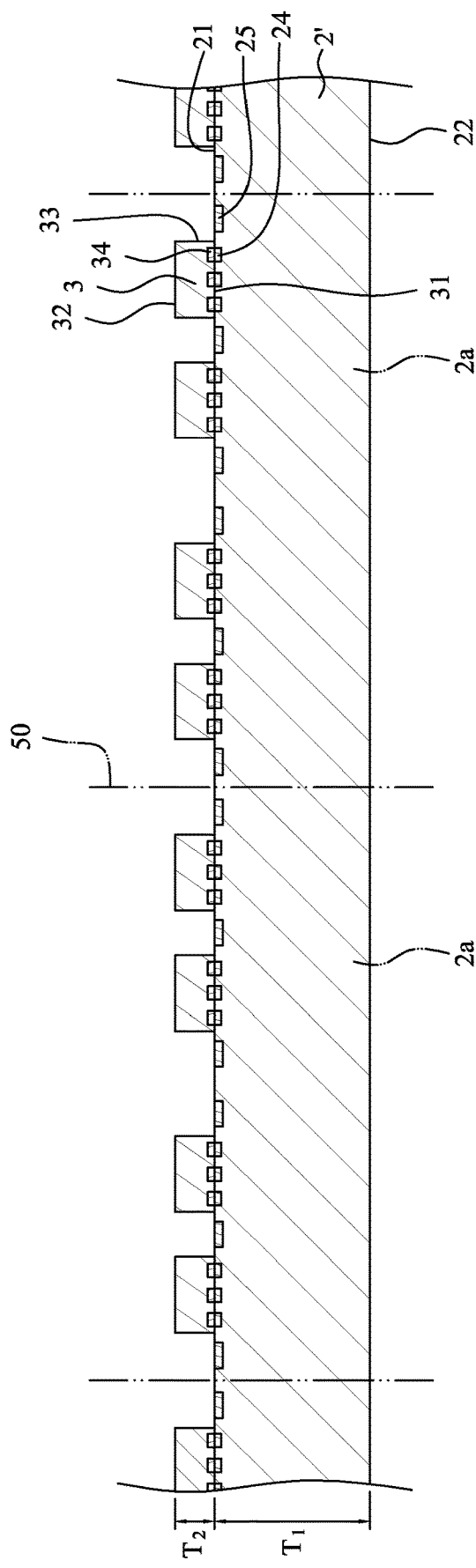
FIG. 11 illustrates a cross-sectional view taken along line 11-11 of FIG. 12.
Figure 12:
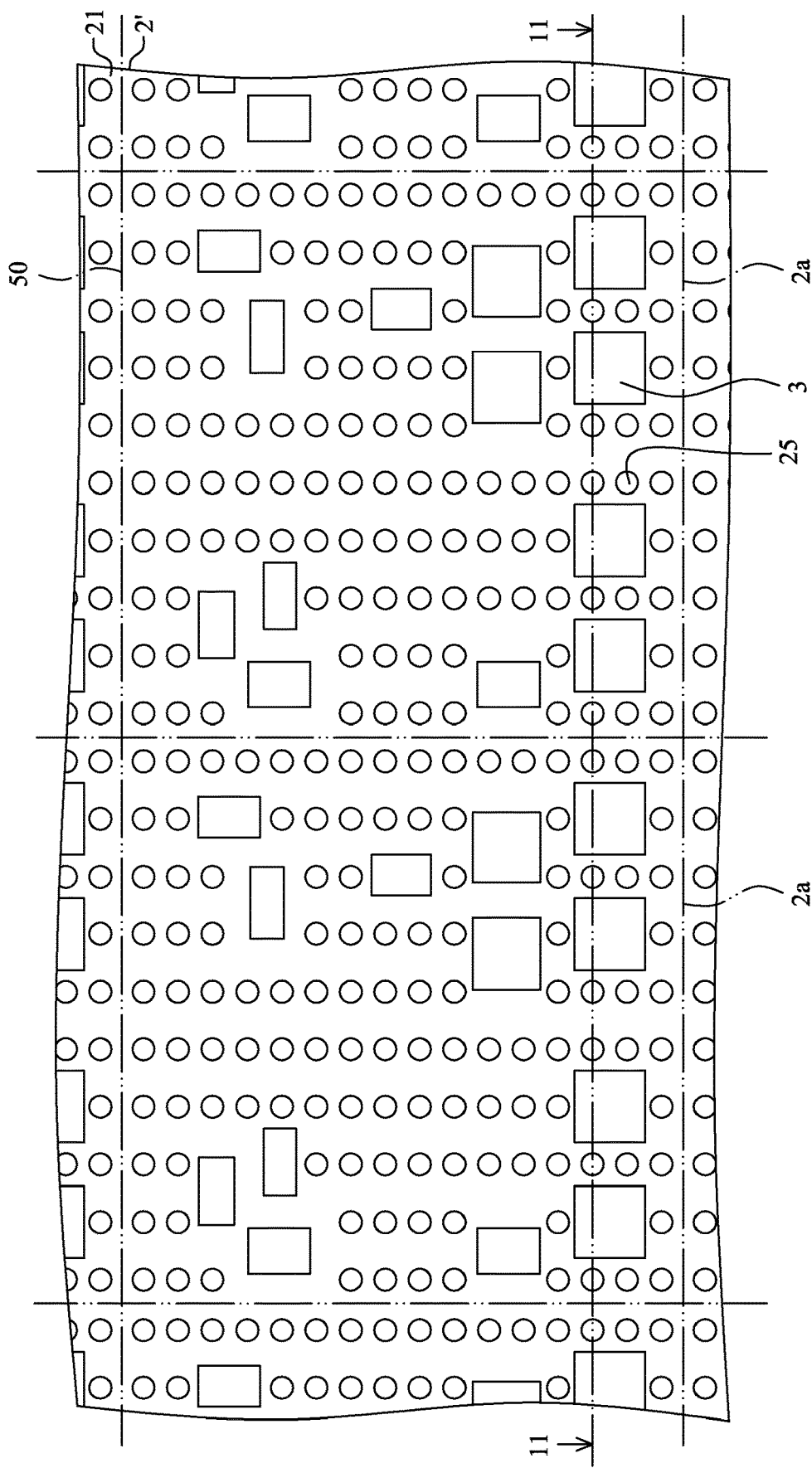
FIG. 12 illustrates one or more stages of an example of a method for manufacturing a device assembly structure according to some embodiments of the present disclosure.

Referring to FIG. 11 and FIG. 12, wherein FIG. 11 illustrates a cross-sectional view taken along line 11-11 of FIG. 12, portions of the second electronic structure 3' are removed to form a plurality of second devices 3 and expose portions (e.g., the bonding pads 25) of the first electronic structure 2'. As shown in FIG. 11 and FIG. 12, the portions of the second electronic structure 3' that are outside the second units 3a are removed by, for example, etching (e.g., dry etching). Thus, the second units 3a (FIG. 10) remain and become the discrete and separated second devices 3. The second devices 3 are disposed on the first active surface 21 of the first electronic structure 2' side by side. For example, each of the second devices 3 may be a passive element such as a decoupling capacitor. As shown in FIG. 11, the second device 3 may have a second active surface 31 (e.g., a lower surface), a second backside surface 32 (e.g., an upper surface) opposite to the second active surface 31, and a lateral surface 33 extending between the second active surface 31 and the second backside surface 32. A thickness $T_2$ of the second devices 3 may be substantially equal to the thickness $T_2$ of the second electronic structures 3' (FIG. 10), since the thickness $T_2$ of the second devices 3 may not be reduced during the stage of FIG. 11 and FIG. 12.

In some embodiments, if a singulation process is conducted along the cutting lines 50 of the first electronic structure 2' after the stage of FIG. 11 and FIG. 12, a plurality of device assembly structures 1 as shown in FIG. 1 may be obtained. Meanwhile, the first units 2a of the first electronic structure 2' become the first devices 2.

Figure 13:
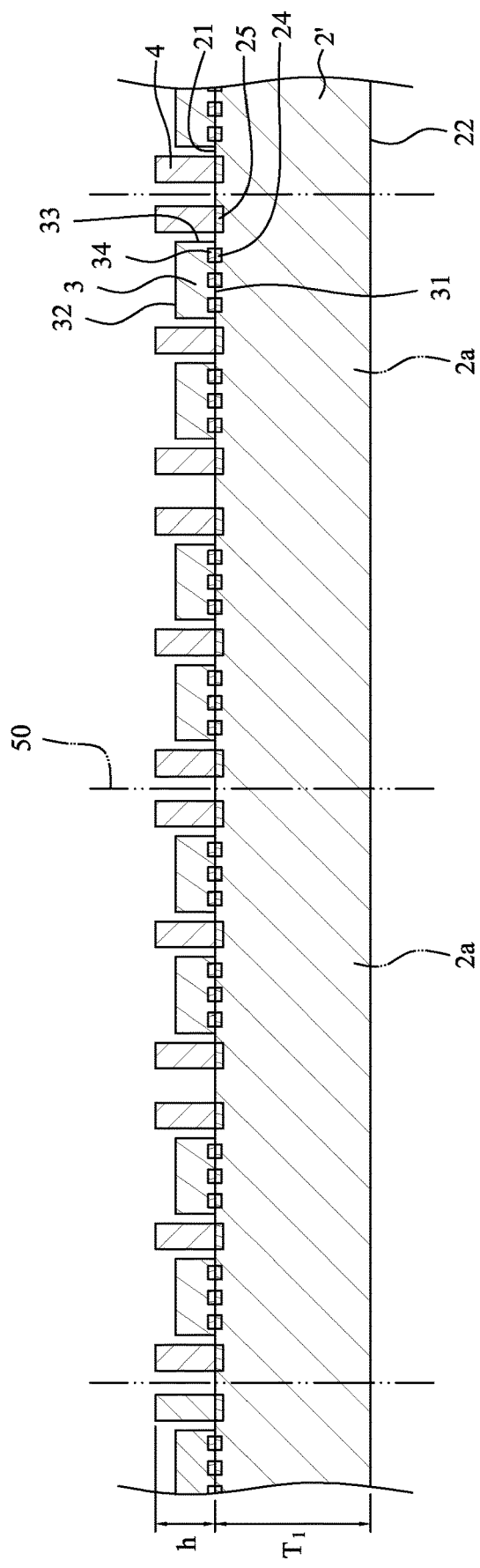
FIG. 13 illustrates a cross-sectional view taken along line 13-13 of FIG. 14.
Figure 14:
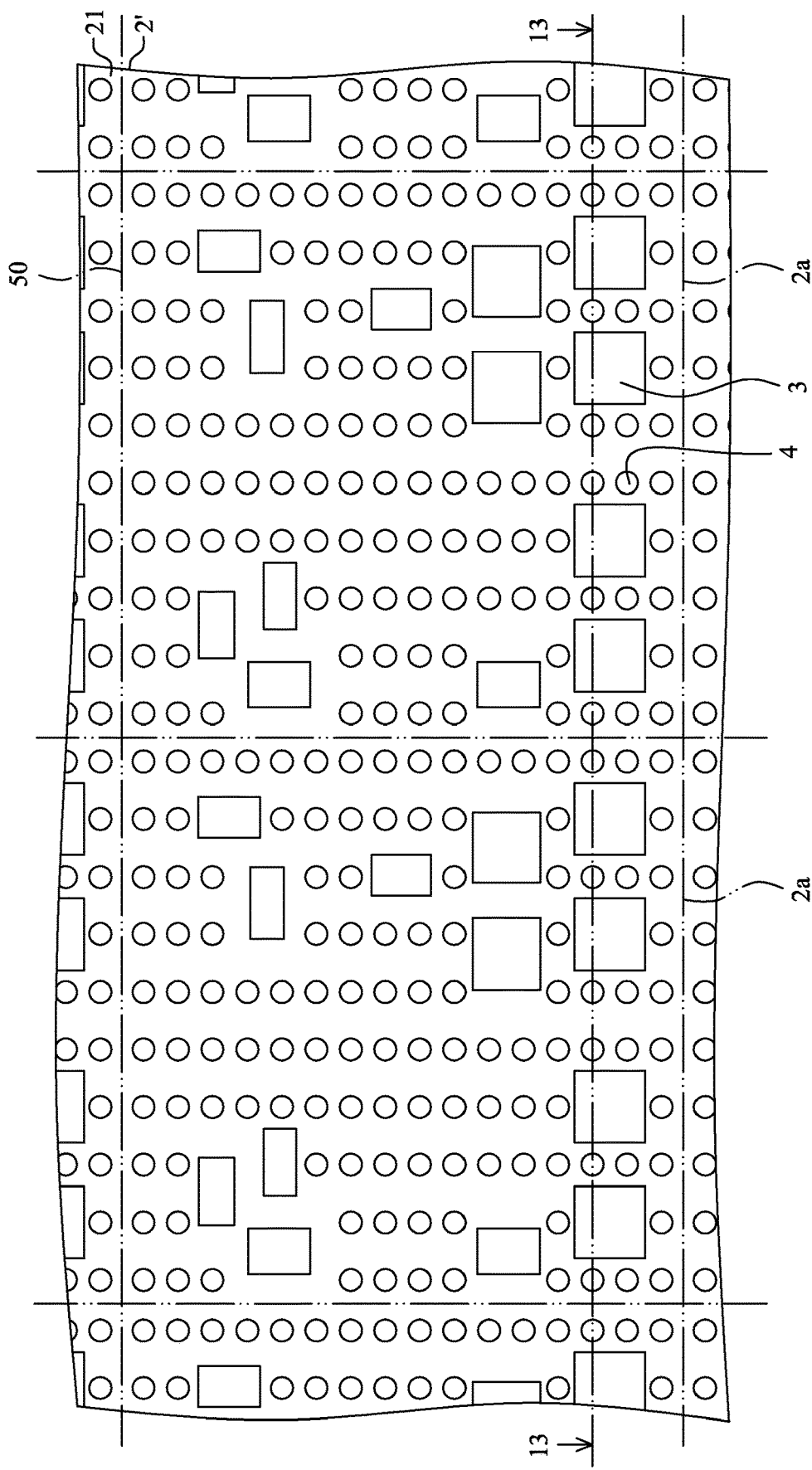
FIG. 14 illustrates one or more stages of an example of a method for manufacturing a device assembly structure according to some embodiments of the present disclosure.

Referring to FIG. 13 and FIG. 14, wherein FIG. 13 illustrates a cross-sectional view taken along line 13-13 of FIG. 14, a plurality of conductive pillars 4 are formed or disposed on a respective one of the bonding pads 25 of the first electronic structure 2'. The conductive pillars 4 may be disposed adjacent to the first active surface 21 of the first electronic structure 2', and surround the second devices 3. A height h of the conductive pillar 4 may be greater than the thickness $T_2$ of the second device 3. In some embodiments, the height h of the conductive pillar 4 may be less than or equal to 50 µm, less than or equal to 30 µm, or less than or equal to 20 µm. Since the thickness $T_2$ of the second device 3 is reduced, the size (e.g., the height h and the width) of the conductive pillar 4 may be reduced accordingly. Thus, the density of the conductive pillars 4 may be increased.

In some embodiments, if a singulation process is conducted along the cutting lines 50 of the first electronic structure 2' after the stage of FIG. 13 and FIG. 14, a plurality of device assembly structures 1a as shown in FIG. 2 may be obtained. Meanwhile, the first units 2a of the first electronic structure 2' become the first devices 2.

Figure 15:
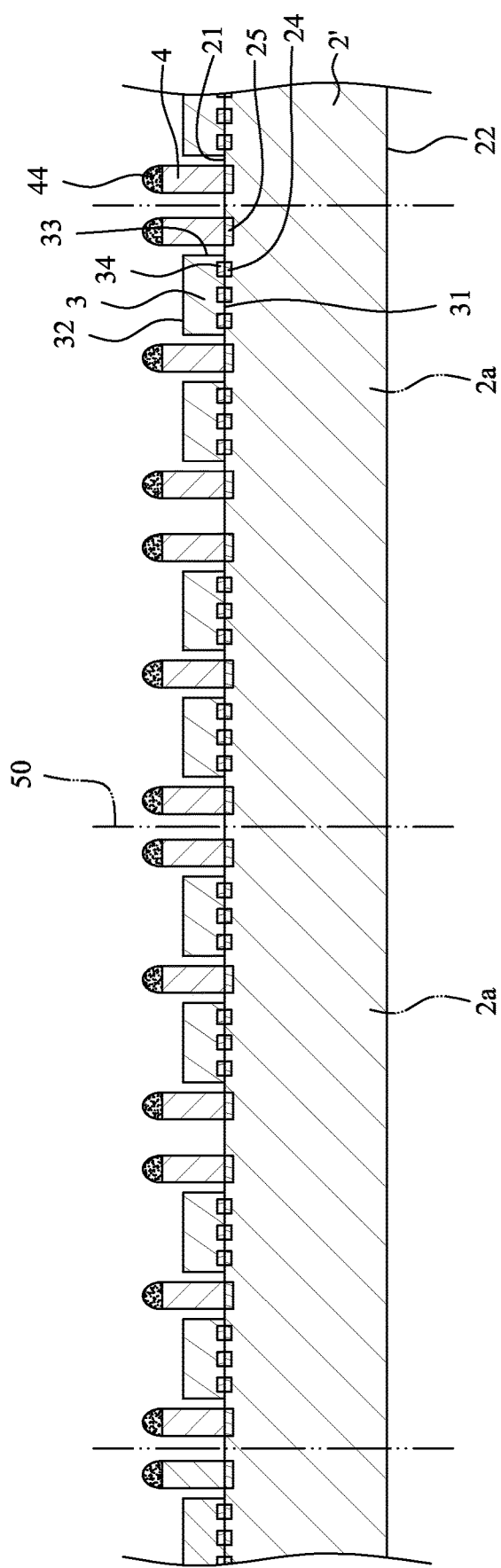
FIG. 15 illustrates a cross-sectional view taken along line 15-15 of FIG. 16.
Figure 16:
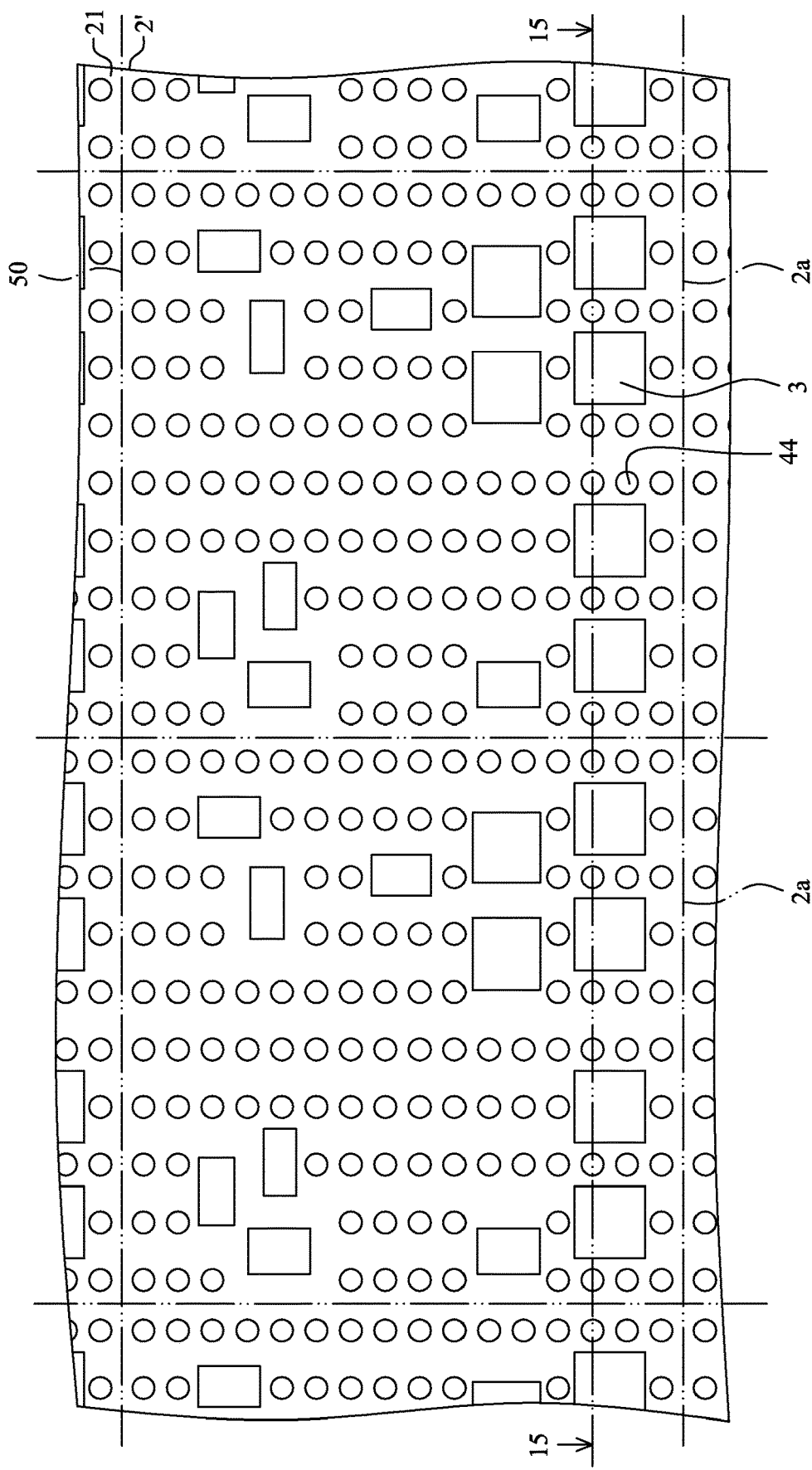
FIG. 16 illustrates one or more stages of an example of a method for manufacturing a device assembly structure according to some embodiments of the present disclosure.

Referring to FIG. 15 and FIG. 16, wherein FIG. 15 illustrates a cross-sectional view taken along line 15-15 of FIG. 16, a plurality of connecting materials 44 are formed or disposed on the tips of the conductive pillars 4. The connecting materials 44 may be solder materials (e.g., solder balls or solder pastes) or pre-solder materials.

In some embodiments, if a singulation process is conducted along the cutting lines 50 of the first electronic structure 2' after the stage of FIG. 15 and FIG. 16, a plurality of device assembly structures 1c as shown in FIG. 3 may be obtained. Meanwhile, the first units 2a of the first electronic structure 2' become the first devices 2.

FIG. 17 through FIG. 20 illustrate a method for manufacturing a device assembly structure according to some embodiments of the present disclosure. In some embodiments, the method is for manufacturing the device assembly structure 1 shown in FIG. 1, the device assembly structure 1a shown in FIG. 2, and the device assembly structure 1b shown in FIG. 3.

Figure 17:
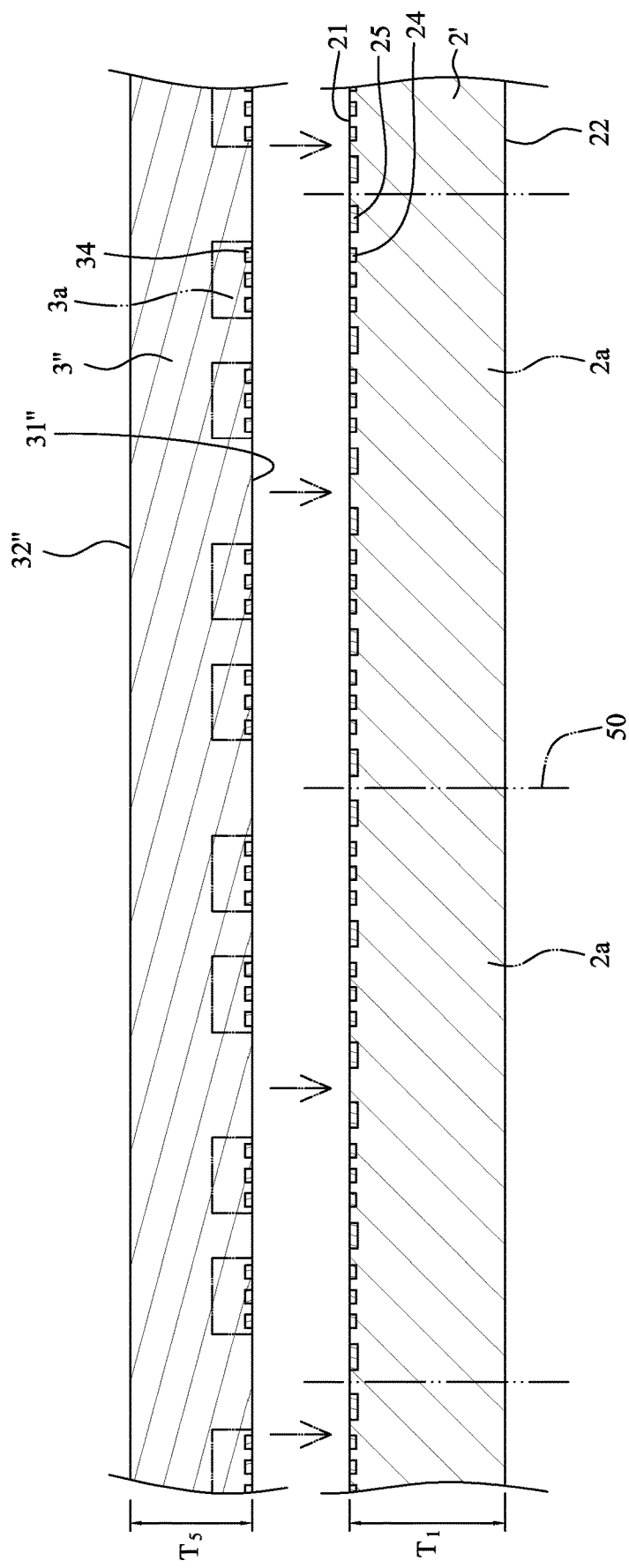
FIG. 17 illustrates one or more stages of an example of a method for manufacturing a device assembly structure according to some embodiments of the present disclosure.

Referring to FIG. 17, a second electronic structure 3" and a first electronic structure 2' are provided. The first electronic structure 2' may be substantially the same as the first electronic structure 2' of FIG. 6 which may be a first wafer. The second electronic structures 3" may be a second wafer, and may include a plurality of second units 3a. The second units 3a may be substantially the same as the second units 3a of FIG. 6. As shown in FIG. 17, the second electronic structure 3" may have a second active surface 31" (e.g., a lower surface) and a second backside surface 32" (e.g., an upper surface) opposite to the second active surface 31". The second units 3a may be disposed adjacent to the second active surface 31" of the second electronic structure 3". A thickness $T_5$ of the second electronic structure 3" may be 500 µm to 800 µm, or 600 µm to 700 µm. In one embodiment, the thickness $T_5$ of the second electronic structure 3" may be substantially equal to the thickness $T_1$ of the first electronic structure 2'. Since both of the first electronic structure 2' and the second electronic structure 3" may have a significant thickness, they are easily to be handled.

Figure 18:
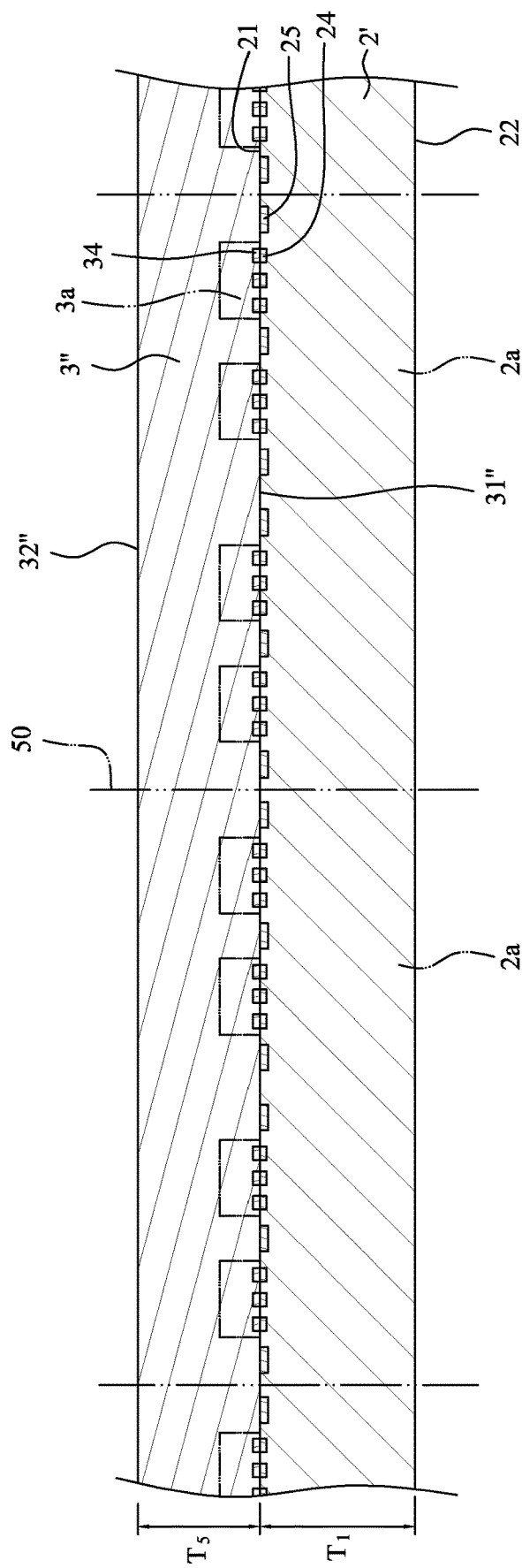
FIG. 18 illustrates one or more stages of an example of a method for manufacturing a device assembly structure according to some embodiments of the present disclosure.

Referring to FIG. 18, the second electronic structures 3" may be disposed on the first active surface 21 of the first electronic structure 2'. In some embodiments, the second electrical contacts 34 of the second electronic structures 3" may be aligned with the first electrical contacts 24 of the first electronic structure 2'. A size of the second electrical contact 34 of the second electronic structures 3" may be substantially equal to the size of the first electrical contact 24 of the first electronic structure 2'. A pitch between the second electrical contacts 34 of the second electronic structures 3" may be substantially equal to a pitch between the first electrical contacts 24 of the first electronic structure 2'. As shown in FIG. 18, the second active surface 31" of the second electronic structures 3" may face and contact the first active surface 21 of the first electronic structure 2', and the second electrical contacts 34 of the second electronic structures 3" may substantially contact the first electrical contacts 24 of the first electronic structure 2' directly.

Then, the second electronic structure 3" and the first electronic structure 2' are heated to an annealing temperature so that the second electrical contacts 34 of the second electronic structures 3" are electrically connected and bonded to the first electrical contact 24 of the first electronic structure 2'. In some embodiments, the annealing temperature may be below or equal to about 250° C., or below or equal to about 200° C. That is, the second electrical contacts 34 of the second electronic structures 3" are attached to the first electrical contacts 24 of the first electronic structure 2' through metal-to-metal bonding rather than surface mounting technology (SMT) or solder bonding. In one embodiment that a material of the second electrical contacts 34 of the second electronic structures 3" includes copper, and a material of the first electrical contacts 24 of the first electronic structure 2' also includes copper, such metal-to-metal bonding is copper-to-copper bonding.

Figure 19:
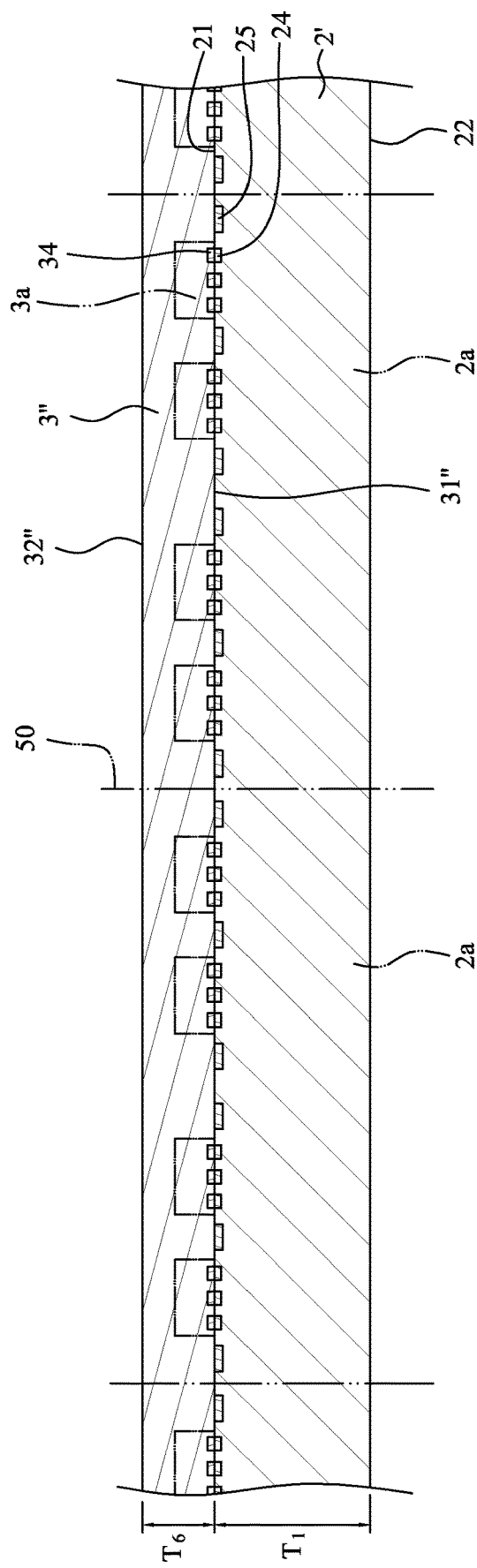
FIG. 19 illustrates one or more stages of an example of a method for manufacturing a device assembly structure according to some embodiments of the present disclosure.
Figure 20:
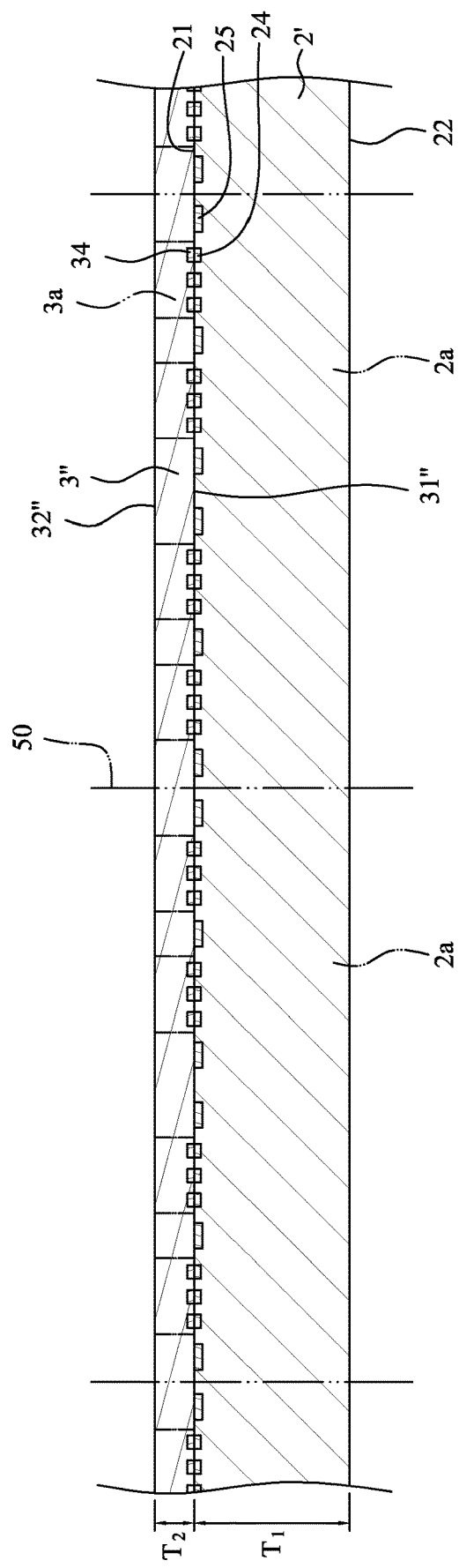
FIG. 20 illustrates one or more stages of an example of a method for manufacturing a device assembly structure according to some embodiments of the present disclosure.

Referring to FIG. 19 and FIG. 20, the second electronic structures 3" is thinned from its second backside surface 32" by two thinning processes. Referring to FIG. 19, a first thinning process is conducted. That is, the second electronic structure 3" is thinned from its second backside surface 32" by the first thinning process. In some embodiments, the first thinning process is grinding. Meanwhile, the thickness of the second electronic structures 3" is reduced from the thickness $T_5$ (FIG. 18) to a thickness $T_6$ (FIG. 19). The thickness $T_6$ of the second electronic structures 3" may be less than or equal to 150 µm, less than or equal to 100 µm, or less than or equal to 75 µm.

Referring to FIG. 20, a second thinning process is conducted. That is, the second electronic structure 3" is further thinned from its second backside surface 32" by the second thinning process. In some embodiments, the second thinning process is etching (e.g., wet etching). Meanwhile, the thickness of the second electronic structures 3" is reduced from the thickness $T_6$ (FIG. 19) to a thickness $T_2$ (FIG. 20). The thickness $T_2$ of the second electronic structures 3" may be less than or equal to 100 µm, less than or equal to 50 µm, or less than or equal to 10 µm. Thus, the thickness $T_2$ of the second electronic structures 3" may be less than or equal to one fifth of the thickness $T_1$ of the first electronic structure 2'. Alternatively, the thickness $T_2$ of the second electronic structures 3" may be less than or equal to one tenth one fiftieth of the thickness $T_1$ of the first electronic structure 2'. The second backside surface 32" of the second electronic structures 3" may be a substantially flat surface. In one embodiment, the flatness of the second backside surface 32" may be less than 3 µm, less than 1 µm, less than 0.5 µm, or less than 0.1 µm.

Then, the following stages of the method may be similar to the stages illustrated in FIG. 11 to FIG. 16 so as to obtain the device assembly structure 1 shown in FIG. 1, the device assembly structure 1a shown in FIG. 2, and the device assembly structure 1b shown in FIG. 3.

As used herein, the terms "substantially," "substantial," "approximately," and "about" are used to denote and account for small variations. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. As another example, a thickness of a film or a layer being "substantially uniform" can refer to a standard deviation of less than or equal to ±10% of an average thickness of the film or the layer, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within 50 µm of lying along a same plane, such as within 40 µm, within 30 µm, within 20 µm, within 10 µm, or within 1 µm of lying along the same plane. Two components can be deemed to be "substantially aligned" if, for example, the two components overlap or are within 200 µm, within 150 µm, within 100 µm, within 50 µm, within 40 µm, within 30 µm, within 20 µm, within 10 µm, or within 1 µm of overlapping. Two surfaces or components can be deemed to be "substantially perpendicular" if an angle therebetween is, for example, 90°±10°, such as ±5°, ±4°, ±3°, ±2°, ±1°, ±0.5°, ±0.1°, or ±0.05°. When used in conjunction with an event or circumstance, the terms "substantially," "substantial," "approximately," and "about" can refer to instances in which the event or circumstance occurs precisely, as well as instances in which the event or circumstance occurs to a close approximation.

In the description of some embodiments, a component provided "on" another component can encompass cases where the former component is directly on (e.g., in physical contact with) the latter component, as well as cases where one or more intervening components are located between the former component and the latter component.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It can be clearly understood by those skilled in the art that various changes may be made, and equivalent elements may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A method of manufacturing a device assembly structure, comprising:
    (a) electrically connecting and bonding at least one second electronic structure to a first electronic structure;
    (b) thinning the second electronic structure by a first thinning process and a second thinning process, wherein the first thinning process is grinding, and the second thinning process is etching; and
    (c) removing portions of the second electronic structure to form a plurality of second devices and expose portions of the first electronic structure.

2. The method of claim 1, wherein in (a), the first electronic structure is a first wafer, and the at least one second electronic structure is a second wafer.

3. The method of claim 1, wherein in (a), the at least one second electronic structure comprises a plurality of second dice.

4. The method of claim 1, wherein in (a), the first electronic structure comprises a plurality of first electrical contacts and bonding pads, the second electronic structure comprises a plurality of second electrical contacts, wherein the second electrical contacts of the second electronic structure are electrically connected and bonded to the first electrical contacts of the first electronic structure; wherein in (c), the bonding pads of the first electronic structure are exposed.

5. The method of claim 1, wherein (a) includes:
    (a1) disposing the second electronic structure on the first electronic structure, wherein the first electronic structure comprises a plurality of first electrical contacts, the second electronic structure comprises a plurality of second electrical contacts, and the second electrical contacts of the second electronic structure are aligned with the first electrical contacts of the first electronic structure; and
    (a2) heating the second electronic structure and the first electronic structure to an annealing temperature so that the second electrical contacts of the second electronic structure are electrically connected and bonded to the first electrical contacts of the first electronic structure.

6. The method of claim 1, wherein in (b), a thickness of the second electronic structure is less than or equal to one fifth of a thickness of the first electronic structure.

7. The method of claim 1, wherein after (c), the method further comprises:
    (d) forming a plurality of conductive pillars on the bonding pads of the first electronic structure.

8. The method of claim 1, wherein in (a), the first electronic structure has a first active surface and a first backside surface opposite to the first active surface, and comprises a plurality of first electrical contacts disposed adjacent to the first active surface; the second electronic structure has a second active surface and a second backside surface opposite to the second active surface, and comprises a plurality of second electrical contacts disposed adjacent to the second active surface, wherein the second active surface of the second electronic structure faces the first active surface of the first electronic structure, and the second electrical contacts of the second electronic structure are electrically connected and bonded to the first electrical contacts of the first electronic structure.

9. The method of claim 8, wherein the second electrical contacts of the second electronic structure are attached to the first electrical contacts of the first electronic structure through metal-to-metal bonding.

\* \* \* \* \*